(12) United States Patent
Cheng et al.

(10) Patent No.: US 8,829,612 B2
(45) Date of Patent: Sep. 9, 2014

(54) METHOD OF FORMING ASYMMETRIC SPACERS AND METHODS OF FABRICATING SEMICONDUCTOR DEVICE USING ASYMMETRIC SPACERS

(75) Inventors: Kangguo Cheng, Beacon, NY (US); Xi Li, Somers, NY (US); Richard Stephen Wise, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 12/983,477

(22) Filed: Jan. 3, 2011

(65) Prior Publication Data

US 2011/0108895 A1      May 12, 2011

Related U.S. Application Data

(62) Division of application No. 11/690,258, filed on Mar. 23, 2007, now Pat. No. 7,892,928.

(51) Int. Cl.
*H01L 29/66* (2006.01)

(52) U.S. Cl.
USPC ............. 257/336; 257/408; 257/E29.268; 438/286

(58) Field of Classification Search
USPC .......... 257/336, 339, 408, E29.268; 438/286, 438/295, 299–300, 302
See application file for complete search history.

(56) References Cited

U.S. PATENT DOCUMENTS

| | | | |
|---|---|---|---|
| 5,656,518 A * | 8/1997 | Gardner et al. | 438/286 |
| 5,783,457 A | 7/1998 | Hsu | |
| 5,789,298 A * | 8/1998 | Gardner et al. | 438/286 |
| 5,893,739 A * | 4/1999 | Kadosh et al. | 438/286 |
| 5,923,982 A | 7/1999 | Kadosh et al. | |
| 5,985,724 A * | 11/1999 | Kadosh et al. | 438/286 |
| 6,168,999 B1 | 1/2001 | Xiang et al. | |
| 6,218,251 B1 | 4/2001 | Kadosh et al. | |
| 6,284,665 B1 | 9/2001 | Lill et al. | |

(Continued)

FOREIGN PATENT DOCUMENTS

| | | | |
|---|---|---|---|
| JP | 62058681 A | 3/1987 | |
| JP | 62058682 A | 3/1987 | |

OTHER PUBLICATIONS

Quirk, Michael, and Julian Serda. Semiconductor Manufacturing Technology. Upper Saddle River, NJ: Prentice Hall, 2001. p. 238.*
Quirk, Michael, and Julian Serda. Semiconductor Manufacturing Technology. Upper Saddle River, N J: Prentice Hall, 2001. p. 238.*

(Continued)

*Primary Examiner* — Mark Tornow
(74) *Attorney, Agent, or Firm* — Schmeiser, Olsen & Watts; Matthew Zehrer (57) ABSTRACT

A method of fabricating asymmetrical spacers, structures fabricated using asymmetrical spacers and an apparatus for fabricating asymmetrical spacers. The method includes: forming on a substrate, a structure having a top surface and opposite first and second sidewalls and having a longitudinal axis parallel to the sidewalls; forming a conformal layer on the top surface of the substrate, the top surface of the structure and the sidewalls of the structure; tilting the substrate about a longitudinal axis relative to a flux of reactive ions, the flux of reactive ions striking the conformal layer at acute angle; and exposing the conformal layer to the flux of reactive ions until the conformal layer is removed from the top surface of the structure and the top surface of the substrate leaving a first spacer on the first sidewall and a second spacer on the second sidewall, the first spacer thinner than the second spacer.

23 Claims, 9 Drawing Sheets

(56) References Cited

U.S. PATENT DOCUMENTS

| | | | |
|---|---|---|---|
| 6,445,016 B1* | 9/2002 | An et al. | 257/192 |
| 6,794,256 B1 | 9/2004 | Fuselier et al. | |
| 6,852,600 B1* | 2/2005 | Wang et al. | 438/301 |
| 7,348,248 B2 | 3/2008 | Cheng | |
| 7,585,735 B2 | 9/2009 | Mathew et al. | |
| 8,017,487 B2* | 9/2011 | Chong et al. | 438/300 |
| 2002/0171113 A1* | 11/2002 | Murakami et al. | 257/408 |
| 2004/0142545 A1* | 7/2004 | Ngo et al. | 438/585 |
| 2006/0186474 A1* | 8/2006 | Matsumoto et al. | 257/347 |
| 2006/0194381 A1* | 8/2006 | Wei et al. | 438/197 |
| 2007/0123010 A1* | 5/2007 | Hoentschel et al. | 438/486 |
| 2007/0235802 A1* | 10/2007 | Chong et al. | 257/346 |
| 2008/0023773 A1* | 1/2008 | Shimamune et al. | 257/377 |

OTHER PUBLICATIONS

Notice of Allowance (Mail Date Oct. 15, 2010) for U.S. Appl. No. 11/690,258, filed Mar. 23, 2007; Confirmation No. 3421.

Keller, J. H. & Kocon, W. W.; "Plasma Properties of a Negative Ion Plasma Reactive Ion Etching System." Jpn. J. Appl. Phys. vol. 38 (1999); Part 1, No. 7B, Jul. 1999; pp. 4280-4282.

Larsen et al.; "Investigations of the Isotropic Etch of an ICP Source for Silicon Microlens Mold Fabrication." Institute of Physics Publishing, Journal of Micromechanics and Microengineering; J. Micromech. Microeng. 15 (2005); pp. 873-882.

Quirk, M. & Serda, J.; "Semiconductor Manufacturing Technology." Prentice Hall: Upper Saddle River, New Jersey. (2001); pp. 453-455.

* cited by examiner

METHOD OF FORMING ASYMMETRIC SPACERS AND METHODS OF FABRICATING SEMICONDUCTOR DEVICE USING ASYMMETRIC SPACERS

This Application is a division of U.S. patent application Ser. No. 11/690,258 filed on Mar. 23, 2007.

FIELD OF THE INVENTION

The present invention relates to the field of method of forming asymmetric spacers; more specifically, it relates to forming spacers of different widths on opposite sides of a raised line, methods of fabricating semiconductor devices using asymmetric spacers and semiconductor having asymmetrical source/drain structures.

BACKGROUND OF THE INVENTION

Asymmetric devices have drawn increasing attention as a method to suppress short channel effects in metal-oxide-silicon field effect transistors (MOSFETS). However, current technology forms asymmetrical devices by adding additional photolithographic process steps to existing methods. Additional photolithographic processes require additional photomasks and exposure tools and add additional time to the fabrication process, making such processes more costly and adversely effecting yield. Therefore, there is a need for a method of fabricating asymmetrical structures, including MOSFETs that do not require photolithographic steps to generate asymmetrical spacers.

SUMMARY OF THE INVENTION

A first aspect of the present invention is a method, comprising: (a) forming on a top surface of a substrate, a structure comprising a top surface and opposite first and second sidewalls and having a longitudinal axis parallel to the sidewalls and to the top surface of the substrate; after (a), (b) forming a conformal layer on the top surface of the substrate, the top surface of the structure and the sidewalls of the structure; after (b), (c) tilting the substrate about an axis parallel to the longitudinal axis relative to a flux of reactive ions directed toward the top surface of the substrate, the flux of reactive ions striking the conformal layer at an angle less than 90° and greater than zero degrees relative to the top surface of the substrate; and after (c), (d) exposing the conformal layer to the flux of reactive ions until the conformal layer is removed from the top surface of the structure and the top surface of the substrate by the flux of reactive ions except in regions of the top surface of the substrate immediately adjacent to the sidewalls of the structure, the exposing leaving a first spacer on the first sidewall and a second spacer on the second sidewall.

A second aspect of the present invention is a structure, comprising: a silicon layer having a top surface; a gate stack comprising a gate dielectric layer on the top surface of the silicon layer and an electrically conductive gate electrode on a top surface of the gate electrode or comprises the gate electrode on the gate dielectric layer, the gate dielectric layer extending along the top surface of the silicon layer on either side of the gate stack; a first spacer on a first sidewall of the gate stack and a second spacer on a second and opposite sidewall of the gate stack, a first width of the first spacer measured from the first sidewall in a first direction perpendicular to the first sidewall is less than a second width of the second spacer measured from the second sidewall in a second direction perpendicular to the second sidewall, the first and second spacers decreasing in width from a bottom surface of the gate stack to a top surface of the gate stack; a first source/drain extension in the silicon layer under the first spacer and a second source/drain extension in the silicon layer under the second spacer, the first and second source/drain extensions separated by a channel region in the layer under the gate stack; a first source/drain in the silicon layer abutting the first source/drain extension and extending away from the channel region and a second source/drain in the silicon layer abutting the second source/drain extension and extending away from the channel region, the first source/drain and the second source/drain both comprising silicon germanium or both comprising carbon-doped silicon.

A third aspect of the present invention is a structure, comprising: a silicon layer having a top surface; a gate stack comprising a gate dielectric layer on the top surface of the silicon layer and an electrically conductive gate electrode on a top surface of the gate electrode or comprises the gate electrode on the gate dielectric layer, the gate dielectric layer extending along the top surface of the silicon layer on either side of the gate stack; a first spacer on a first sidewall of the gate stack and a second spacer on a second and opposite sidewall of the gate stack, a first width of the first spacer measured from the first sidewall in a first direction perpendicular to the first sidewall equal to a second width of the second spacer measured from the second sidewall in a second direction perpendicular to the second sidewall, the first and second spacers decreasing in width from a bottom surface of the gate stack to a top surface of the gate stack; a first source/drain extension in the silicon layer under the first spacer and a second source/drain extension in the silicon layer under the second spacer, the first and second source/drain extensions separated by a channel region in the layer under the gate stack; a first diffused-source/drain in the silicon layer abutting the first source/drain extension and extending away from the channel region and a second diffused-source/drain in the silicon layer abutting the second source/drain extension and extending away from the channel region; and a first hetero-source/drain in the silicon layer, abutting the first source/drain extension and extending away from the channel region and a second hetero-source/drain in the silicon layer separated from the second source/drain extension by the second diffused-source/drain and extending away from the channel region, the first hetero-source/drain and the second hetero-source/drain both comprising silicon germanium or both comprising carbon-doped silicon.

A fourth aspect of the present invention is a structure, comprising: a silicon layer having a top surface; a gate stack comprising a gate dielectric layer on the top surface of the silicon layer and an electrically conductive gate electrode on a top surface of the gate electrode or comprises the gate electrode on the gate dielectric layer, the gate dielectric layer extending along the top surface of the silicon layer on either side of the gate stack; a first spacer on a first sidewall of the gate stack, a second spacer on a second and opposite sidewall of the gate stack and a third spacer on the second spacer, a first width of the first spacer measured from the first sidewall in a first direction perpendicular to the first sidewall equal to a second width of the second spacer measured from the second sidewall in a second direction perpendicular to the second sidewall, the first, second and third spacers decreasing in width from a bottom surface of the gate stack to a top surface of the gate stack; a first source/drain extension in the silicon layer under the first spacer and a second source/drain extension in the silicon layer under the second and third spacers, the first and second source/drain extensions separated by a channel region in the layer under the gate stack; a first source/drain in the silicon layer abutting the first source/drain extension and extending away from the channel region and a second source/drain in the silicon layer abutting the second source/drain extension and extending away from the channel region, a first distance between the first source/drain and the channel region measured through the first source/drain extension region less than a second distance between the second source/drain and the channel region measured through the second source/drain extension region.

A fifth aspect of the present invention is an apparatus, comprising: a chamber having a gas inlet and an exhaust port connected to a vacuum pump; a magnetic filter positioned between means for generating an electron/reactive gas ion plasma from a gas supplied through the gas inlet and means for holding a substrate at a pre-selected angle between 0° and 90° relative to a plane defined by the magnetic filter; and means for applying a bias voltage to the means for holding the substrate.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
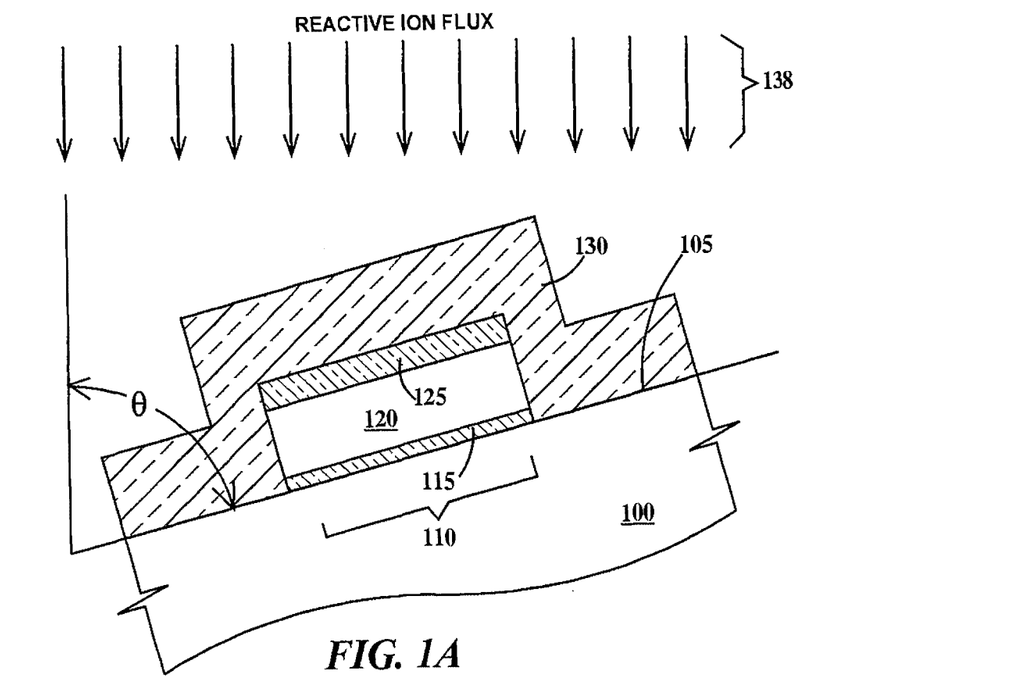
FIGS. 1A and 1B illustrate fabrication of asymmetrical spacers according to embodiments of the present invention.
Figure 1B:
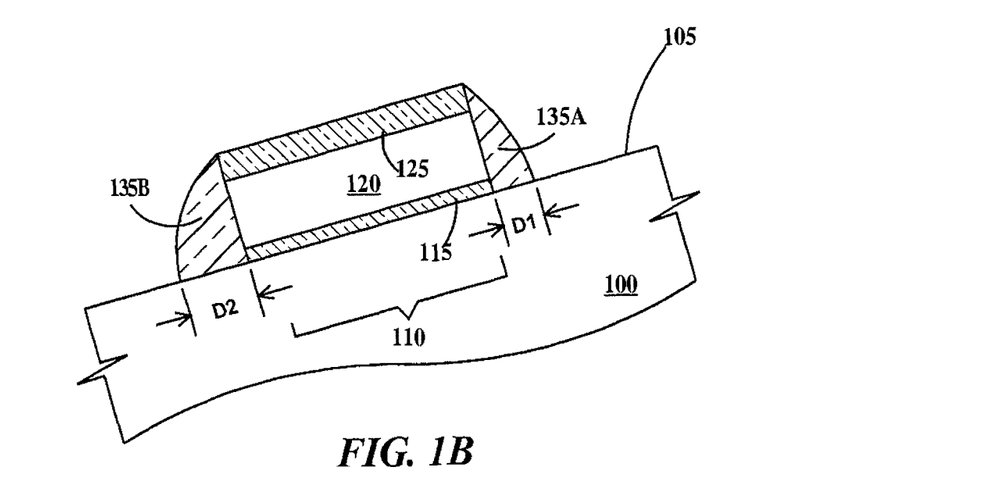

FIGS. 1A and 1B illustrate fabrication of asymmetrical spacers according to embodiments of the present invention. In FIG. 1, formed on a substrate 100 is a gate stack 110 comprising a dielectric layer 115 on a top surface 105 of the substrate, an electrically conductive gate electrode 120 on top of the dielectric layer and an optional dielectric capping layer 125 on top of the gate electrode. Formed on top surface 105 and sidewalls and a top surface of gate stack 110 is a conformal dielectric layer 130. A conformal layer is usually formed by a blanket deposition of a material to form a coating that follows the contours of the surface(s) being coated as opposed to a non-conformal layer where low spots in the surface being coated are filled in to give a flat or quasi-flat surface to the deposited layer. In one example, a conformal layer covers horizontal (e.g. top surface 105 defining the horizontal plane) and vertical surfaces (e.g. sidewalls of gate stack 110) to about the same thickness. The thickness of the layer may be less or greater on vertical surfaces than on horizontal surfaces. Substrate 100 is positioned in a flux of reactive ions 138 (i.e. reactive with conformal layer 130) with top surface 105 of substrate 100 forming an acute (less than 90°) angle θ to the direction of the reactive ion flux, which etches conformal layer 130.

In FIG. 1B, after reactive ion etch (RIE) of conformal layer 130 (see FIG. 1A), asymmetrical sidewall spacers 135A and 135B have been formed on opposite sidewalls of gate stack 110. Spacer 135A has been formed on the gate stack 110 sidewall that was closest to the reactive ion flux and spacer 135B has been formed on the gate stack 110 sidewall that was furthest from the reactive ion flux. Spacer 135A extends along top surface 105 of substrate 100 a distance D1 from gate stack 110 and spacer 135B extends along top surface 105 of substrate 100 a distance D2 from gate stack 110. D2 is greater than D1.

In one example, substrate 100 is a single-crystal bulk silicon wafer or an SOI wafer (wafers are generally flat circular disks.) In one example, gate dielectric layer 115 comprises silicon dioxide ($SiO_2$), silicon nitride ($Si_3N_4$), silicon carbide (Si:C), silicon oxy nitride (SiON), silicon oxy carbide (SiOC), organosilicate glass (Si:COH), plasma-enhanced silicon nitride ($PSiN_x$) or NBLok (Si:C(N,H)). In one example gate dielectric layer 115 is a high K (dielectric constant) material, examples of which include but are not limited to metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof. A high K dielectric material has a relative permittivity above about 10. In one example, gate dielectric layer 115 is about 0.5 nm to about 20 nm thick. In one example, gate electrode 120 comprises polysilicon, doped polysilicon, metal, metal silicide or combinations thereof. In one example, capping layer 125 comprises $SiO_2$, $Si_3N_4$, Si:C, SiON, SiOC, Si:COH, $PSiN_x$ or Si:C(N,H). In one example, capping layer 125 is about 5 nm to about 200 nm thick. In one example, spacers 135A and 135B comprise $SiO_2$ or $Si_3N_4$.

While gate dielectric layer 115 is illustrated in FIGS. 1A and 1B as extending only under gate electrode 120, alternatively, gate dielectric layer 115 may extend over the entire top surface 105 and particularly under spacers 135A and 135B. With gate dielectric layer 115 covering top surface 105, substrate 100 is protected from attack by the reactive ion flux during the RIE and exposed gate dielectric layer may be removed at any appropriate step after formation of spacers 135A and 135B.

It should be understood that the present invention is not limited to forming asymmetrical spacers on a gate stack, but can be applied to forming asymmetrical spacers on any mesa-like structure having a top surface and two opposing sidewalls.

Figure 2A:
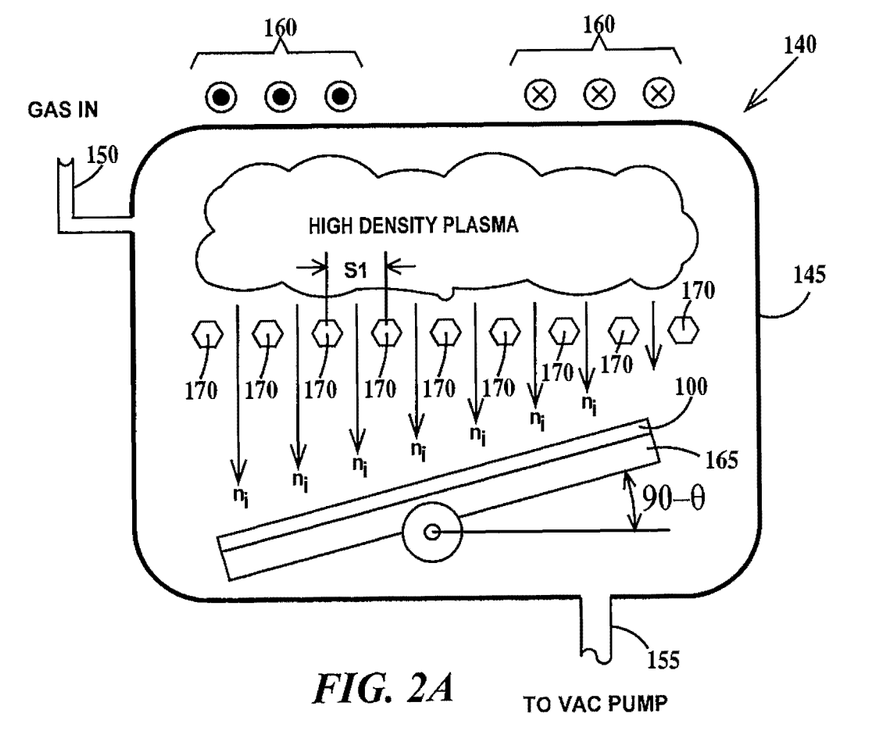
FIG. 2A is a schematic representation of an exemplary apparatus for fabricating asymmetrical spacers according to embodiments of the present invention.

FIG. 2A is a schematic representation of an exemplary apparatus for fabricating asymmetrical spacers according to embodiments of the present invention. In FIG. 2A, an RIE tool 140 includes a process chamber 145, a gas inlet 150 (or inlets) and exhaust port 155, inductive coils 160 (coupled to a plasma power supply, not shown), a tiltable stage 165 and an array of magnetic filter cores 170. In operation, substrate 100 is placed on stage 165 and the stage tilted at an angle of (90-θ)° (θ was defined supra) and a non-equilibrium high density plasma (e.g. about $10^{12}$ to about $10^{13}$ ions/cm$^3$) is struck. Reactive ions formed in the plasma are drawn toward stage 165, passing between magnetic filter cores 170, by a biasing voltage applied to stage 165. A fixed stage (i.e. θ is fixed) may be substituted for tiltable stage 165. A flux of reactive ions then passes through magnetic filter cores 170 and strike wafer 100 at an angle θ relative to the top surface of the substrate. Magnetic filter cores 170 are spaced apart a distance S1, which is less than half the gyroradius of an electron at the magnetic field strength generated by the magnetic filter cores. In one example, a magnetic field of about 5 G to about 500 G is generated by magnetic filter cores 170. A typical etchant gas for SiO$_2$ or Si$_3$N$_4$ is CH$_x$F$_{4-x}$. Alternatively, the plasma may be capacitively coupled to the plasmas generating power supply instead of being inductively coupled to the power supply.

Figure 2B:
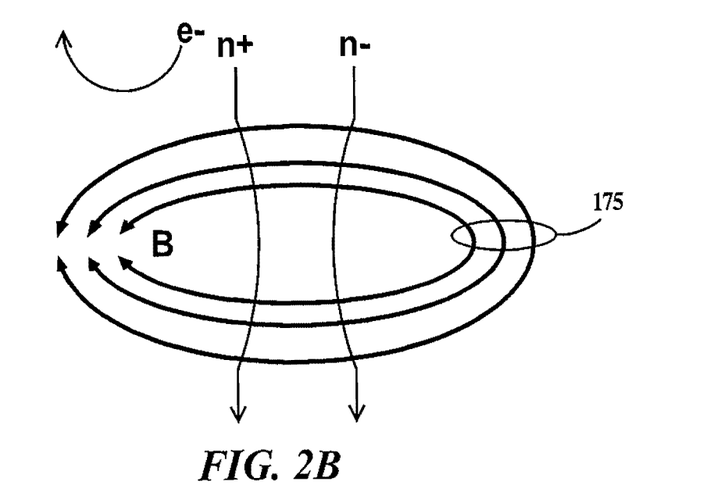
FIG. 2B is a diagram illustrating the method of keeping incident species normal to a wafer being etched in the exemplary apparatus of FIG. 2B.

FIG. 2B is a diagram illustrating the method of keeping incident species normal to a wafer being etched in the exemplary apparatus of FIG. 2B. Lines 175 represent the magnetic field B. The path of electrons (e−), positive ions (n+), and negative ions (n−) are illustrated. Electrons do not pass through the magnetic field while ions pass through perpendicular to the field. The gyroradius r$_g$ defines the radius of circular motion of a charged particle in the presence of a uniform magnetic field and is given by equation (1):

$$r_g = \frac{mv_\perp}{|q|B} \quad (1)$$

where:
m is the mass of the charged particle,
v⊥ is the velocity component perpendicular to the direction of the magnetic field,
q is the charge on the particle, and
B is the constant magnetic field.

For a typical electron at less than 20 eV, its gyroradius under a 50 G applied magnetic field is approximately 0.5 cm. By setting S1 to less than 1 cm, all electrons with electron temperature less than 20 eV will be excluded from the region below magnetic filter cores 170 (see FIG. 2A), whereas less mobile ions (positive or negative) will not. This results in a flux of charged ions only through the magnetic filter region, and a consequent build-up of ion-ion plasma between the magnetic filter and the substrate. Since the formation of a sheath just above the surface of a substrate in a plasma environment requires a differential mobility between charged species in gaseous plasma (e.g. electrons and ions), there is no sheath formed above substrate 100 in the inventive method because electrons have been excluded from the region just above the substrate by magnetic filter cores 170 and a self-bias is generated in the direction normal to the wafer surface. Reactive neutral species are still present above the wafer. With appropriate chemistry selection etching will proceed preferentially on the spacer sidewall titled toward the incident ion flux.

Figure 3A:
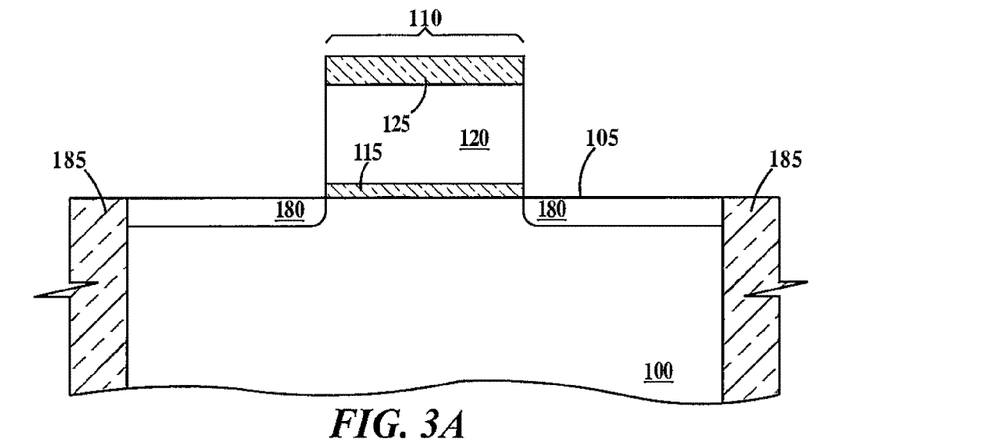
FIGS. 3A through 3E are cross-sectional drawings illustrating fabrication of a first MOSFET device according to embodiments of the present invention.

FIGS. 3A through 3E are cross-sectional drawings illustrating fabrication of a first MOSFET device according to embodiments of the present invention. In FIG. 3A, formed on substrate 100 is gate stack 110 comprising dielectric layer 115 on top surface 105 of the substrate, electrically conductive gate electrode 120 on top of the dielectric layer and optional dielectric capping layer 125 on top of the gate electrode. A source/drain extensions 180 have been formed on opposite sides of gate stack 110 by, for example, ion implantation of a dopant species such as arsenic, phosphorus or boron using the gate stack as an ion implantation mask. A trench isolation 185 is formed in substrate 100 abutting source/drain extensions 180.

In one example, trench isolation is formed prior to formation of gate stack 110. Trench isolation 185 extends from top surface 105 of substrate 100 into the substrate. Trench isolation 185 may be formed by etching a trench into substrate 100, depositing a dielectric layer over substrate 100 to completely fill the trenches and then performing a chemical-mechanical polish to coplanarize top surface 105 of substrate 100 and a top surface of trench isolation 185. In one example, trench isolation comprises high-density plasma (HDP) silicon oxide or chemical-vapor-deposition (CVD) tetraethoxysilane (TEOS) oxide. In one example, trench isolation 185 comprises a dielectric liner, such as SiO$_2$ and a polysilicon core.

Figure 3B:
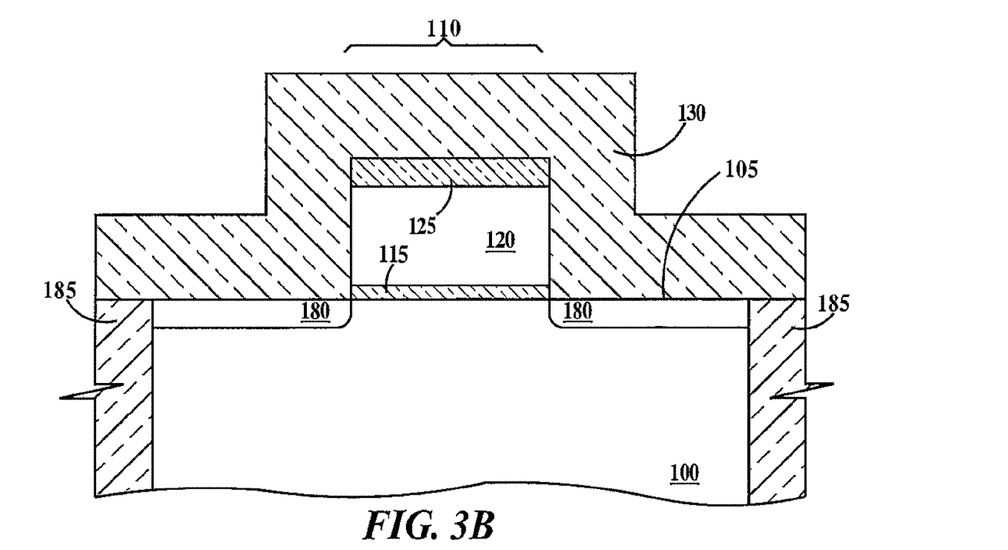

In FIG. 3B, formed on top surface 105 and on sidewalls and the top surface of gate stack 110 is conformal dielectric layer 130.

Figure 3C:
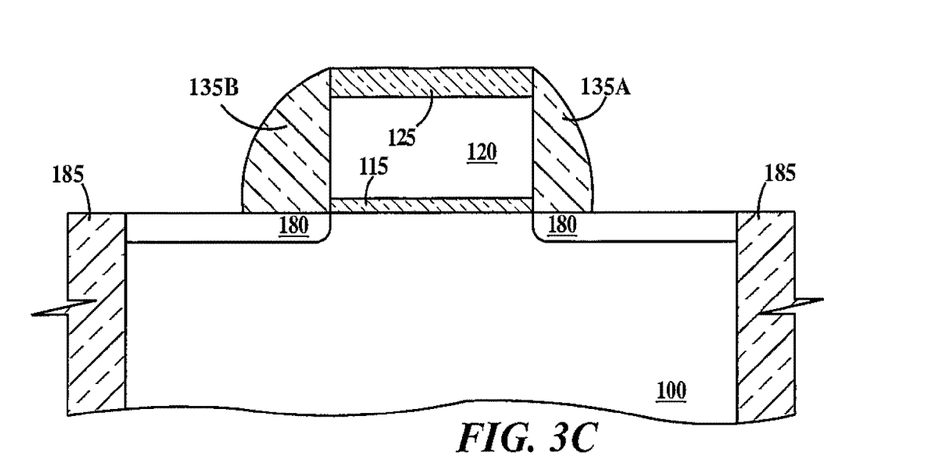

In FIG. 3C, a tilted RIE process as illustrated in FIGS. 1A, 1B, 2A and 2B and described supra has been performed to form asymmetrical spacers 135A and 135B. Spacers 135A and 135B extend over source/drain extensions 180 toward trench isolation and do not completely cover the source/drain extensions.

Figure 3D:
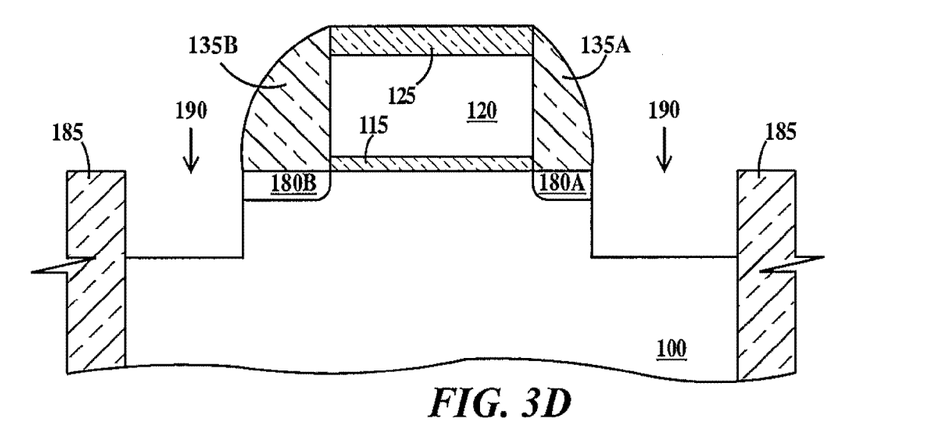

In FIG. 3D, trenches 190 are etched through source/drain extensions 180 into substrate 100 to form a first source/drain extensions 180A under spacer 135A and a second source/drain extensions 180B under spacer 135B, where the source/drain extensions 180 (see FIG. 3C) was not protected by spacers 135A and 135B. Trenches 190 are bounded by trench isolation 185 on one side as shown and on opposite ends not shown, see discussion infra.

Figure 3E:
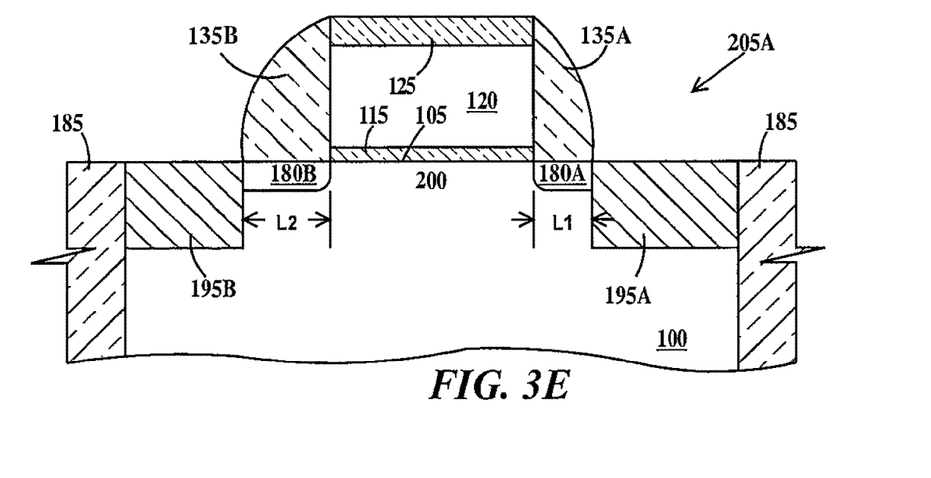

In FIG. 3E, a first hetero-source/drain 195A and a second hetero-source/drain 195B of an FET 205A are formed by epitaxially growing silicon germanium (SiGe) if FET 205A is a p-channel FET (PFET) or carbon-doped silicon (Si:C) if FET 205A is an n-channel FET (NFET), in trenches 190 (see FIG. 2D). If FET 205A is a PFET, first and second source/drain extensions 180A and 180B are doped P-type and substrate 100 is doped N-type) or the region of substrate 100 illustrated in FIG. 3E is doped N-type (i.e. is an N-well). If FET 205A is a NFET, first and second hetero-source/drains 195A and 195B, first and second source/drain extensions 180A and 180B are doped N-type and substrate 100 is doped P-type) or the region of substrate 100 illustrated in FIG. 3E is doped P-type (i.e. is a P-well). First source/drain extension 180A has length L1 and second source/drain extension 180B has a length L2, with L2 greater than L1. It should be understood, that the cross-sections of FIGS. 1A, 1B, 3A, 3B, 3C, 3D, 3E, 3F, 3G, 3H, 4A, 4B, 4C, 5, 6 and 7 are in a lengthwise direction, with a widthwise direction running into and out of the plane of the drawing, the lengthwise direction and widthwise direction being perpendicular and lying in a plane parallel to a plane defined by top surface 105 of substrate 100. Trench isolation 185 surrounds FET 205A along the entire perimeter of FET 205A. From an end view of FET 205A (also FET 205D of FIG. 5), trench isolation 185 would abut first and second hetero-source/drains 195A and 195B, first and second source/drain extensions 180A and 180B and channel region 200 laterally isolating the FET.

Because of the SiGe or Si:C source/drains, a channel region 200 between the first source/drain extensions 180A and the second source/drain extensions 180B under gate 120 is under compressive or tensile stress, so FET 205A is a strained FET. Further, because L1 is not equal to L2, FET is also an asymmetrical FET. First and second hetero-source/drains 195A and 195B may be doped in-situ during epitaxial growth (to form a self-aligned source/drains) or doped afterwards by ion implantation other suitable techniques such as plasma doping.

Figure 3F:
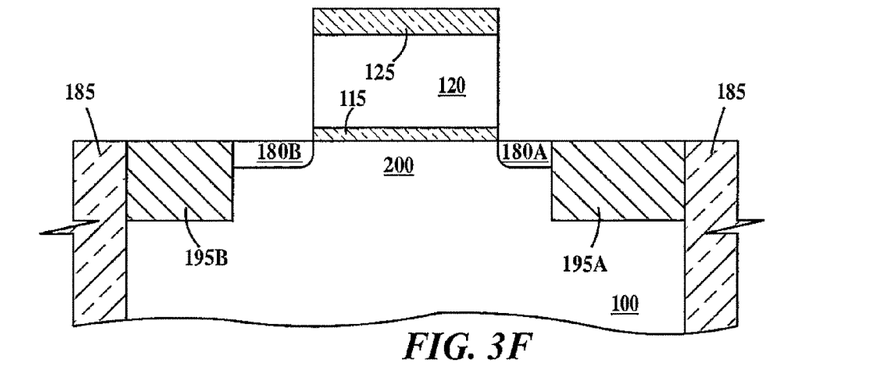
FIGS. 3F through 3H are cross-sectional drawings illustrating additional steps for fabricating a second MOSFET according to embodiments of the present invention.

FIGS. 3F through 3H are cross-sectional drawings illustrating additional steps for fabricating a second MOSFET according to embodiments of the present invention. In FIG. 3F, first and second spacers 180A and 180B of FIG. 3E are removed by wet or dry etching.

Figure 3G:
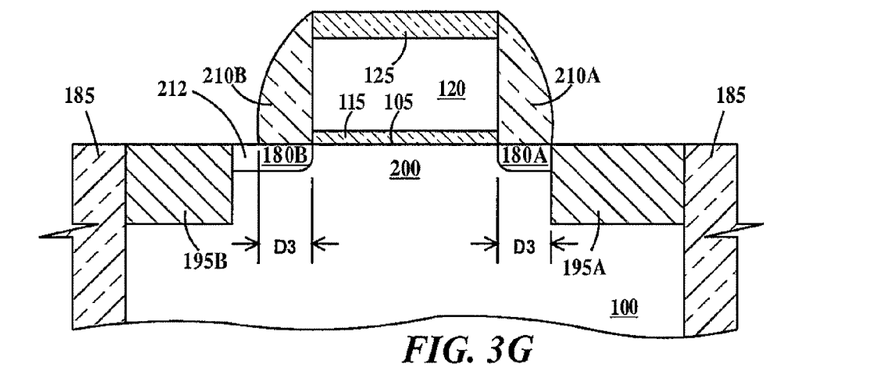

In FIG. 3G, conventional symmetrical spacers 210A and 210B are formed on opposite sidewalls of gate stack 110. Conventional spacers are formed depositing a conformal layer followed by RIE etching the conformal layer with the substrate top surface perpendicular to the direction of the reactive ion flux (e.g. θ=90°). Both spacers 210A and 210B extend along top surface 105 of substrate 100 a distance D3 from gate stack 110 toward trench isolation 185. A portion 212 of second source/drain extensions 180B is not covered by spacer 210B, while all of spacer 180A is covered by spacer 210A.

Figure 3H:
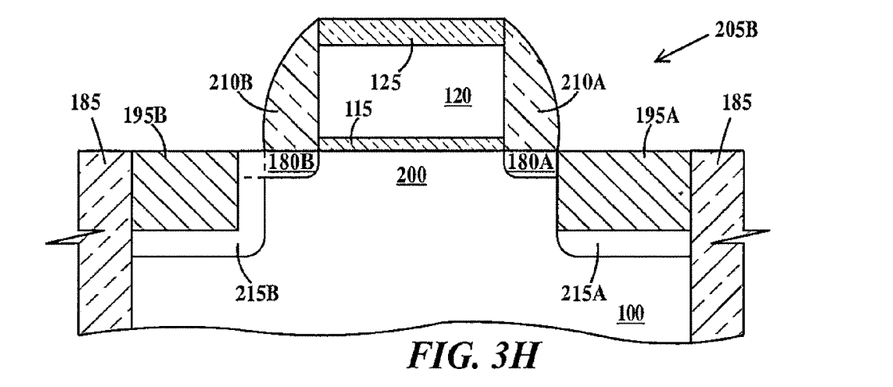

In FIG. 3H, an FET 205B is completed by forming first and second diffused-source/drains 215A and 215B in substrate 100 by ion implantation or plasma doping (of a P-type dopant if FET 205B is a PFET and an N-type dopant if FET 205B is an NFET) where the substrate is not protected by gate stack 110, spacers 210A and 210B or trench isolation 185. From an end view of FET 205B (also FET 205E of FIG. 6), trench isolation 185 would abut first and second hetero-source/drains 195A and 195B, first and second diffused-source/drains 215A and 215B, first and second source/drain extensions 180A and 180B and channel region 200 laterally isolating the FET.

Figure 4A:
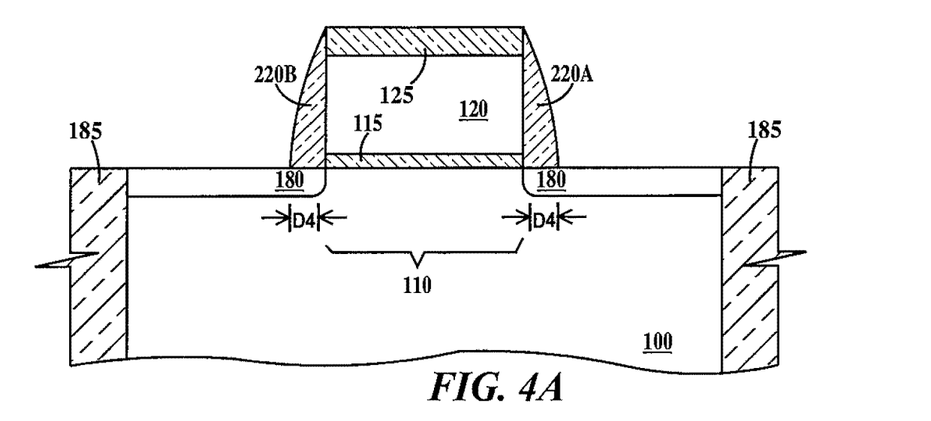
FIGS. 4A through 4C are cross-sectional drawings illustrating fabrication of a third MOSFET device according to embodiments of the present invention.
Figure 4B:
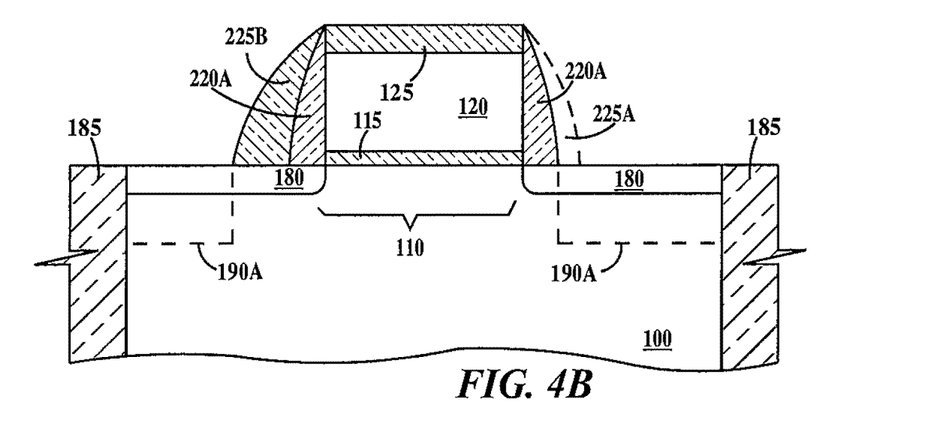
Figure 4C:
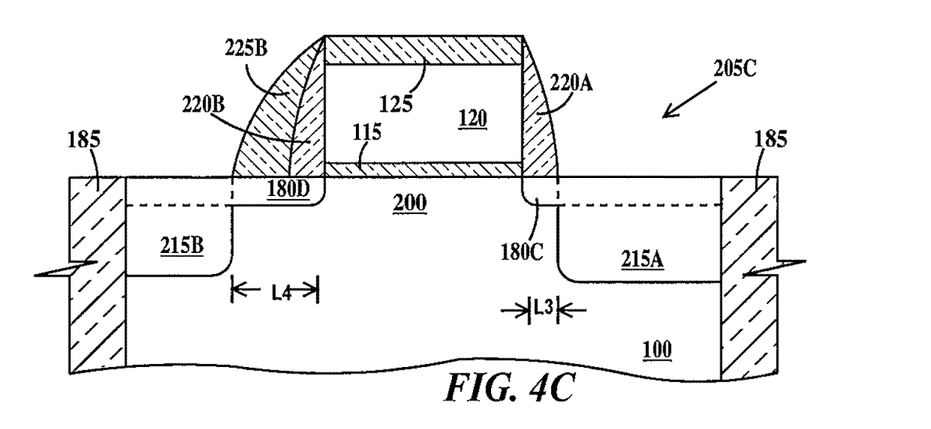

FIGS. 4A through 4C are cross-sectional drawings illustrating fabrication of a third MOSFET device according to embodiments of the present invention. In FIG. 4A, formed on substrate 100 is gate stack 110 comprising dielectric layer 115 on top surface 105 of the substrate, electrically conductive gate electrode 120 on top of the dielectric layer and optional dielectric capping layer 125 on top of the gate electrode. Source/drain extensions 180 have been formed on opposite sides of gate stack 110. Trench isolation 185 has been formed in substrate 100 abutting source/drain extensions 180. And conventional symmetrical spacers 220A and 220B have been formed on opposite sidewalls of gate stack 110. Both spacers 220A and 220B extend along top surface 105 of substrate 100 a distance D4 from gate stack 110 toward trench isolation 185.

In FIG. 4B, a spacer 225B is formed over spacer 220B. Spacers 220A and 220B are a different material than the material of spacer 225B. Spacer 225B is formed by performing a tilted RIE process as described supra, at a sufficient angle and length of time so as to remove any spacer that might be formed on spacer 220A. Alternatively, by adjustment of angle and time, a spacer 225A (dashed lines) will be formed simultaneously with spacer 225B. Spacer 225A will have a smaller width than that of spacer 225B (see for example, FIG. 1B).

In FIG. 4C, an FET 205C is completed by forming source/drains 215A and 215B in substrate 100 by ion implantation (of a P-type dopant if FET 205B is a PFET and an N-type dopant if FET 205B is an NFET) where the substrate is not protected by gate stack 110, spacers 210A, 210B and 220B and trench isolation 185. In FIG. 4C, a first source/drain extensions 180C has length L3 and second source/drain extensions 180D has a length L4, with L4 greater than L3. In one example, spacers 220A and 220B are $SiO_2$ and spacers 225B (and 225A, if present) are $Si_3N_4$. From an end view of FET 205C (also FET 205F of FIG. 7), trench isolation 185 would abut first and second diffused source/drains 215A and 215B, first and second source/drain extensions 180A and 180B and channel region 200 laterally isolating the FET.

Figure 11:
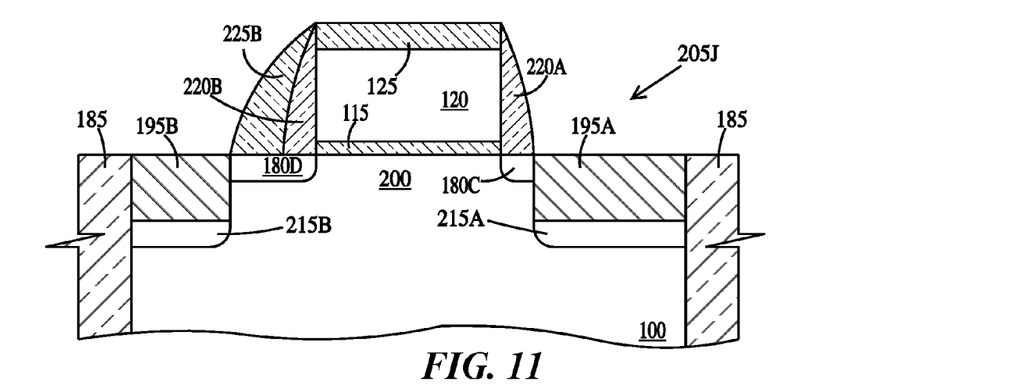
FIG. 11 is a cross-section of a fourth MOSFET device according to embodiments of the present invention.
Figure 12:
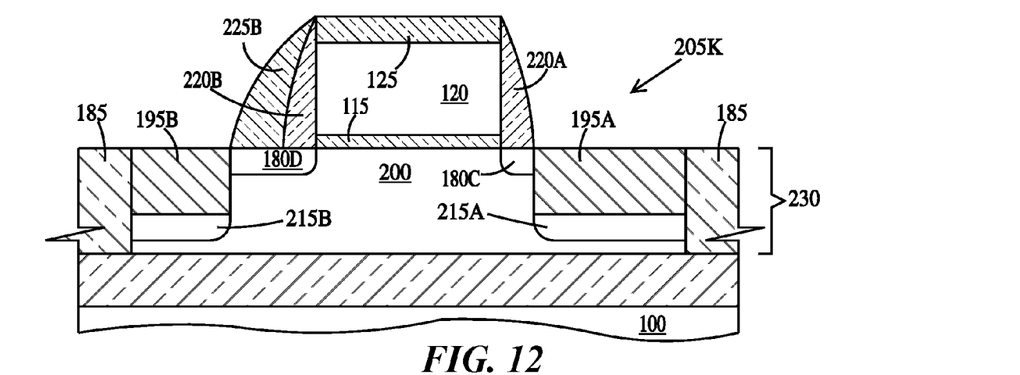
FIG. 12 is a cross-sectional drawing of a fourth MOSFET device fabricated on an SOI substrate.
Figure 13:
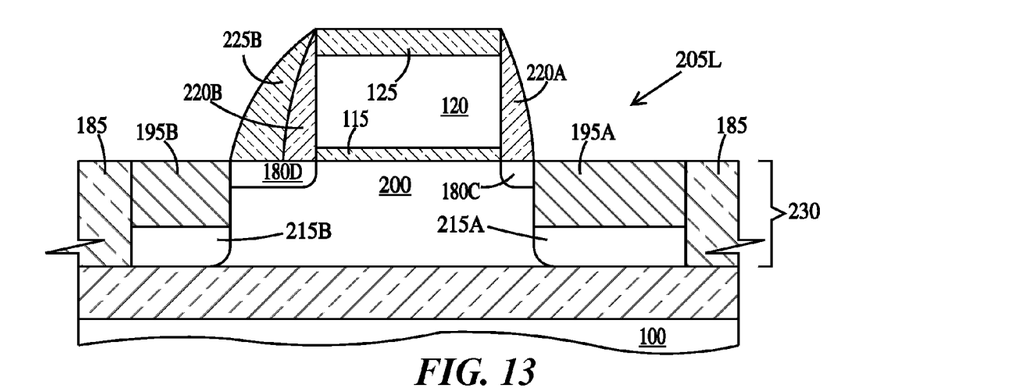
FIG. 13 is a cross-sectional drawing of a fourth MOSFET where the diffused source/drains of FIG. 7 abut the buried oxide layer of the SOI substrate.

In order to fabricate a fourth MOSFET device according to the present invention, it is necessary to return to FIG. 4B. At this point in the process, trenches 190A may be formed in substrate 100 where the substrate is not protected by gate stack 110, spacers 220A, 220B and 225B (and 225A if present) and trench isolation 185 and then filled with either SiGe or Si:C as described supra, in which case source/drains 215A and 215B of FIG. 4C would both include SiGe or Si:C as illustrated in FIGS. 11 and 12. In one embodiment, diffused source drains 215A and 215B also abut BOX 234 as illustrated in FIG. 13.

Figure 5:
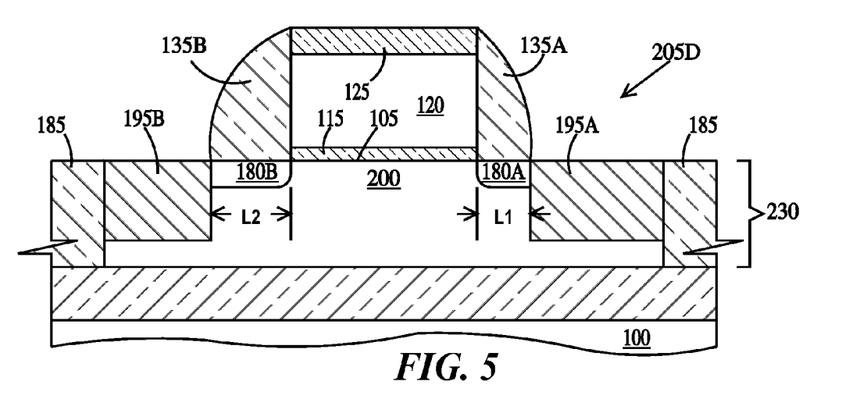
FIG. 5 is a cross-sectional drawing of the first MOSFET device fabricated on a silicon-on-insulator (SOI) substrate.
Figure 8:
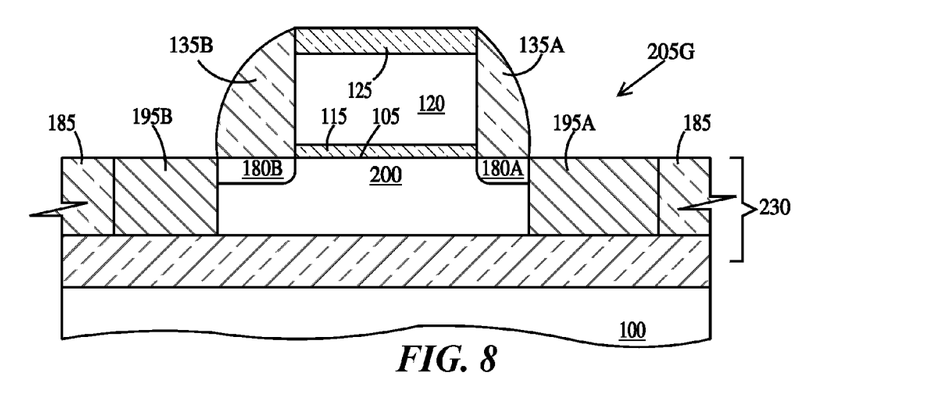
FIG. 8 is a cross-sectional drawing of the first MOSFET where the hetero-source/drains of FIG. 5 abut the buried oxide layer of the SOI substrate.

FIG. 5 is a cross-sectional drawing of the first MOSFET device fabricated on a SOI substrate. In FIG. 5, an FET 205D is similar to FET 205A of FIG. 3E except, trench isolation 185, hetero-source/drains 195A and 195B, source/drain extensions 180A and 180B and channel region 200 are formed in a single-crystal silicon layer 230 separated from substrate 100 by a buried insulating layer such as buried oxide layer (BOX) 235. Trench isolation abuts BOX 235. In one embodiment, hetero-source/drains 195A and 195B also abut BOX 235 as illustrated in FIG. 8.

Figure 6:
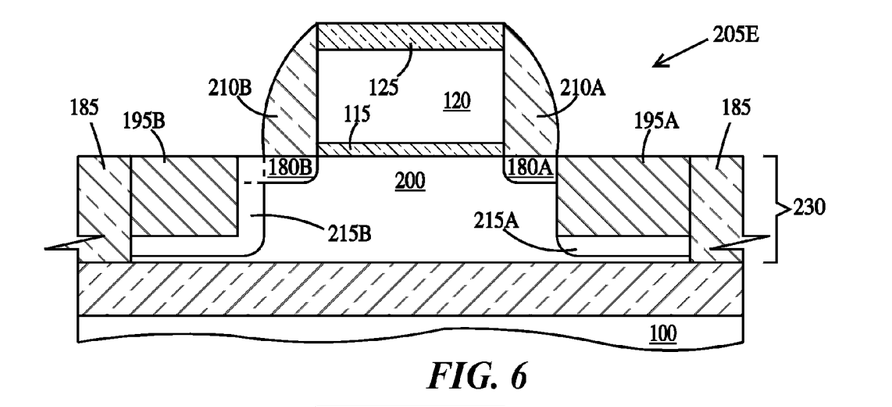
FIG. 6 is a cross-sectional drawing of the second MOSFET device fabricated on an SOI substrate.
Figure 9:
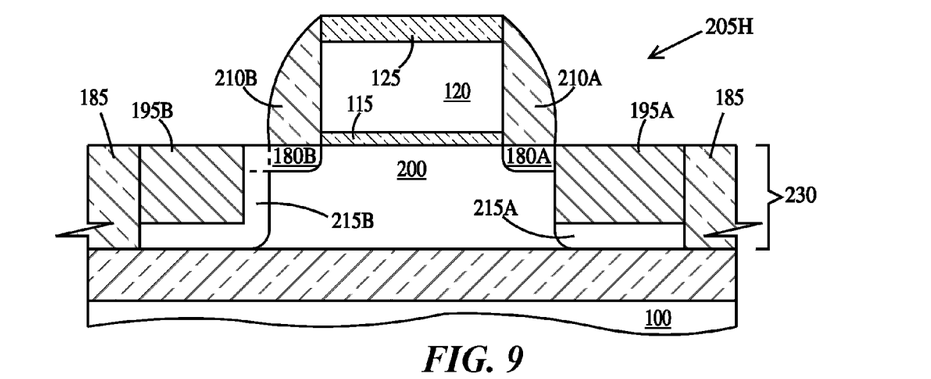
FIG. 9 is a cross-sectional drawing of the second MOSFET where the diffused source/drains of FIG. 6 abut the buried oxide layer of the SOI substrate.

FIG. 6 is a cross-sectional drawing of the second MOSFET device fabricated on an SOI substrate. In FIG. 6, an FET 205E is similar to FET 205B of FIG. 3H except, trench isolation 185, hetero-source/drains 195A and 195B, diffused source/drains 215A and 215B source/drain extensions 180A and 180B and channel region 200 are formed in a single-crystal silicon layer 230 separated from substrate 100 by BOX 235. Trench isolation abuts BOX 235. In one embodiment, diffused source/drains 215A and 215B also abut BOX 235 as illustrated in FIG. 9.

Figure 7:
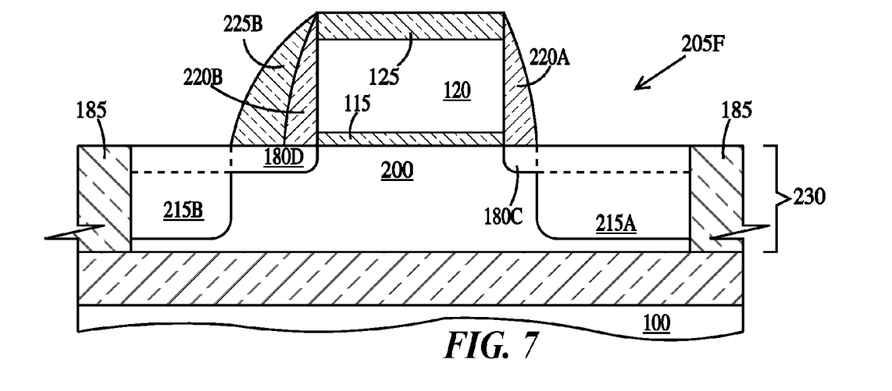
FIG. 7 is a cross-sectional drawing of the third MOSFET device fabricated on a SOI substrate.
Figure 10:
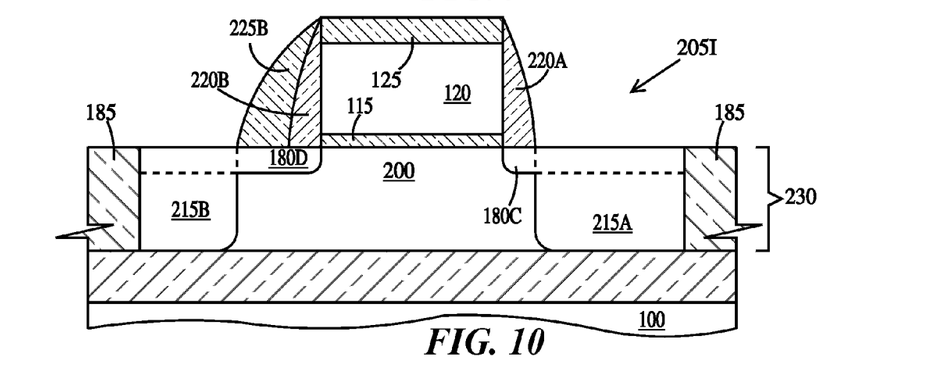
FIG. 10 is a cross-sectional drawing of the third MOSFET where the diffused source/drains of FIG. 7 abut the buried oxide layer of the SOI substrate.

FIG. 7 is a cross-sectional drawing of the third MOSFET device fabricated on a SOI substrate. In FIG. 7, an FET 205F is similar to FET 205C of FIG. 4C except, trench isolation 185, diffused source/drains 215A and 215B, 205B source/drain extensions 180A and 180B and channel region 200 are formed in a single-crystal silicon layer 230 separated from substrate 100 by BOX 235. Trench isolation 185 abuts BOX 235. In one embodiment, diffused source/drains 215A and 215B also abut BOX 235 as illustrated in FIG. 10.

Thus the present invention provides a method of fabricating asymmetrical spacers and asymmetrical MOSFETs without defining the asymmetrical elements with photolithographic steps.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
a silicon layer having a top surface;
a gate stack comprising a gate dielectric layer on said top surface of said silicon layer and an electrically conductive gate electrode on a top surface of said gate dielectric layer;
a first spacer on a first sidewall of said gate stack and a second spacer on a second and opposite sidewall of said gate stack, a first width of said first spacer measured from said first sidewall in a first direction perpendicular to said first sidewall is equal to a second width of said second spacer measured from said second sidewall in a second direction perpendicular to said second sidewall, said first and second spacers decreasing in width from a bottom surface of said gate stack to a top surface of said gate stack;
a first source/drain extension in said silicon layer under said first spacer and a second source/drain extension in said silicon layer under said second spacer, said first and second source/drain extensions separated by a channel region in said layer under said gate stack;
a first diffused-source/drain in said silicon layer abutting said first source/drain extension and extending away from said channel region and a second diffused-source/drain in said silicon layer abutting said second source/drain extension and extending away from said channel region; and
a first hetero-source/drain in said silicon layer, abutting said first source/drain extension and extending away from said channel region and a second hetero-source/drain in said silicon layer separated from said second source/drain extension by said second diffused-source/drain and extending away from said channel region, said first hetero-source/drain and said second hetero-source/drain both comprising silicon-germanium or both comprising carbon-doped silicon.

2. The structure of claim 1, further including:
a buried insulating layer abutting a bottom surface of said silicon layer and an additional silicon layer abutting a bottom surface of said buried insulating layer; and
a dielectric filled trench extending from said top surface of said silicon layer to a top surface of said buried oxide layer, said dielectric trench abutting first sides of said first and second hetero-source/drains, opposite ends of said first and second hetero-source/drains, first sides of said first and second diffused-source/drains, opposites ends of said first and second diffused-source/drains opposite ends of said first and second source/drain extensions and opposite ends of said channel region.

3. The structure of claim 2, wherein said first and second diffused-source/drains abut said buried insulating layer.

4. The structure of claim 1, wherein said gate stack further includes a dielectric capping layer on a top surface of said gate electrode.

5. The structure of claim 1, wherein:
said first diffused-source/drain extends from said top surface through an entire bottom surface of said first hetero-source/drain into said silicon layer;
said second diffused-source/drain extends from said top surface through an entire bottom surface of said second hetero-source/drain into said silicon layer; and said second diffused-source/drain extends from said top surface of said silicon layer between said second hetero-source/drain and said second source/drain extension into said silicon layer.

6. The structure of claim 1, wherein said gate dielectric layer extends along said top surface of said silicon layer on either side of said gate stack.

7. The structure of claim 1, wherein said first hetero-source/drain and said second hetero-source/drain both comprise epitaxial silicon-germanium or both comprise epitaxial carbon-doped silicon.

8. A structure, comprising:
a silicon layer having a top surface;
a gate stack comprising a gate dielectric layer on said top surface of said silicon layer and an electrically conductive gate electrode on a top surface of said gate dielectric layer;
a first spacer on a first sidewall of said gate stack, a second spacer on a second and opposite sidewall of said gate stack and a third spacer on said second spacer, a first width of said first spacer measured from said first sidewall in a first direction perpendicular to said first sidewall equal to a second width of said second spacer measured from said second sidewall in a second direction perpendicular to said second sidewall, said first, second and third spacers decreasing in width from a bottom surface of said gate stack to a top surface of said gate stack;
a first source/drain extension in said silicon layer under said first spacer and a second source/drain extension in said silicon layer under said second and third spacers, said first and second source/drain extensions separated by a channel region in said layer under said gate stack;
a first diffused-source/drain in said silicon layer abutting said first source/drain extension and extending away from said first source/drain extension and said channel region and a second diffused-source/drain in said silicon layer abutting said second source/drain extension and extending away from said second source/drain extension and said channel region, a first distance between said first diffused-source/drain and said channel region measured in said first direction is less than a second distance between said second diffused-source/drain and said channel region measured in said second direction; and
wherein said second distance is equal to the widest width of said second spacer measured in said second direction added to a widest width of said third spacer measure in said second direction.

9. The structure of claim 8, further including:
a buried insulating layer abutting a bottom surface of said silicon layer and an additional silicon layer abutting a bottom surface of said buried insulating layer; and
a dielectric filled trench extending from said top surface of said silicon layer to a top surface of said buried insulating layer, said dielectric trench abutting first sides of said first and second source/drains, opposite ends of said first and second source/drains, opposite ends of said first and second source/drain extensions and opposite ends of said channel region.

10. The structure of claim 9, wherein said first and second diffused-source/drains abut said buried insulating layer.

11. The structure of claim 8, wherein said gate stack further includes a dielectric capping layer on a top surface of said gate electrode.

12. The structure of claim 9, further including:

a fourth spacer on said first spacer, a fourth width of said fourth spacer measured from said first sidewall in said first direction less than a third width of said third spacer measured from said second sidewall in said second direction, said fourth spacer decreasing in width from said bottom surface of said gate stack to said top surface of said gate stack, said first source/drain spacer extending completely under said fourth spacer.

13. The structure of claim 8, wherein said gate dielectric layer extends along said top surface of said silicon layer on either side of said gate stack.

14. The structure of claim 8, wherein a height of said second spacer measured in a third direction perpendicular to said top surface of said silicon layer is at least as great as a height of said third spacer measured in said third direction.

15. The structure of claim 8, wherein said first and second diffused-source/drains both include silicon-germanium regions or both include carbon-doped silicon regions, said first and second diffused-source/drain regions extending into said silicon layer from said top surface of said silicon layer further than said silicon-germanium regions or carbon-doped silicon regions extend from said top surface of said silicon layer into said silicon layer.

16. The structure of claim 15, further including:

a buried insulating layer abutting a bottom surface of said silicon layer and an additional silicon layer abutting a bottom surface of said buried insulating layer; and a dielectric filled trench extending from said top surface of said silicon layer to a top surface of said buried insulating layer, said dielectric trench abutting first sides of said first and second source/drains, opposite ends of said first and second diffused-source/drains, opposite ends of said first and second source/drain extensions and opposite ends of said channel region.

17. The structure of claim 16, wherein said first and second diffused-source/drains abut said buried insulating layer.

18. The structure of claim 15, further including:

a fourth spacer on said first spacer, a fourth width of said fourth spacer measured from said first sidewall in said first direction less than a third width of said third spacer measured from said second sidewall in said second direction, said fourth spacer decreasing in width from said bottom surface of said gate stack to said top surface of said gate stack, said first source/drain extension extending completely under said fourth spacer.

19. The structure of claim 18, further including:

a buried insulating layer abutting a bottom surface of said silicon layer and an additional silicon layer abutting a bottom surface of said buried insulating layer; and a dielectric filled trench extending from said top surface of said silicon layer to said top surface of said buried insulating layer, said dielectric trench abutting first sides of said first and second diffused-source/drains, opposite ends of said first and second diffused-source/drains, opposite ends of said first and second source/drain extensions and opposite ends of said channel region.

20. The structure of claim 19, wherein said first and second diffused-source/drains abut said buried insulating layer.

21. The structure of claim 15, wherein:

said first diffused-source/drain extends from said top surface through an entire bottom surface of said first hetero-source/drain into said substrate;

said second diffused-source/drain extends from said top surface through an entire bottom surface of said second hetero-source/drain into said substrate; and said second diffused-source/drain extends from said top surface of said substrate between said second hetero-source/drain and said second source/drain extension into said substrate.

22. The structure of claim 15, wherein said silicon-germanium regions comprise respective first and second silicon-germanium filled trenches and said carbon-doped silicon regions comprise respective first and second carbon-doped silicon filled trenches.

23. The structure of claim 15, wherein said silicon-germanium regions comprise epitaxial silicon-germanium and said carbon-doped silicon regions comprise epitaxial carbon-doped silicon.

* * * * *